United States Patent
Li et al.

(10) Patent No.: US 11,495,707 B2
(45) Date of Patent: Nov. 8, 2022

(54) ALGAN UNIPOLAR CARRIER SOLAR-BLIND ULTRAVIOLET DETECTOR AND MANUFACTURING METHOD THEREOF

(71) Applicant: CHANGCHUN INSTITUTE OF OPTICS, FINE MECHANICS AND PHYSICS, CHINESE ACADEMY OF SCIENCES, Changchun (CN)

(72) Inventors: Dabing Li, Changchun (CN); Ke Jiang, Changchun (CN); Xiaojuan Sun, Changchun (CN); Yang Chen, Changchun (CN); Yuping Jia, Changchun (CN); Hang Zang, Changchun (CN)

(73) Assignee: CHANGCHUN INSTITUTE OF OPTICS, FINE MECHANICS AND PHYSICS, CHINESE ACADEMY OF SCIENCES, Changchun (CN)

( * ) Notice: Subject to any disclaimer, the term of this patent is extended or adjusted under 35 U.S.C. 154(b) by 0 days.

(21) Appl. No.: 17/324,118

(22) Filed: May 19, 2021

(65) Prior Publication Data

US 2021/0328092 A1    Oct. 21, 2021

Related U.S. Application Data

(63) Continuation of application No. PCT/CN2020/110792, filed on Aug. 24, 2020.

(30) Foreign Application Priority Data

Apr. 17, 2020  (CN) .......................... 202010305301.0

(51) Int. Cl.
*H01L 21/00*  (2006.01)
*H01L 31/18*  (2006.01)
(Continued)

(52) U.S. Cl.
CPC .. *H01L 31/1848* (2013.01); *H01L 31/022416* (2013.01); *H01L 31/03048* (2013.01); *H01L 31/11* (2013.01)

(58) Field of Classification Search
CPC ......... H01L 31/1848; H01L 31/022416; H01L 31/03048; H01L 31/11; H01L 31/107;
(Continued)

(56) References Cited

U.S. PATENT DOCUMENTS 10,510,916 B2* 12/2019 Mazraehno ......... H01L 31/1848
2013/0292685 A1  11/2013 Jiang et al.
(Continued)

FOREIGN PATENT DOCUMENTS

CN   102201484 A   9/2011
CN   107452820 A   12/2017
(Continued)

OTHER PUBLICATIONS

International Search Report issued in corresponding International application No. PCT/CN2020/110792, dated Jan. 7, 2021.
(Continued)

*Primary Examiner* — Calvin Y Choi

(57) ABSTRACT

Provided is an AlGaN unipolar carrier solar-blind ultraviolet detector that is based on the AlGaN polarization effect and that uses the double heterojunction of the p-AlzGa1-zN/i-AlyGa1-yN/n-AlxGa1-xN (0.45=<x,z<y) as the main structure of the detector. It makes full use of the polarization built-in electric field pointing from n-type AlGaN to p-type AlGaN to enhance the electric field strength of the i-type absorption region and enhance the efficiency of carrier absorption and separation. At the same time, the valence band step of the p-AlzGa1-zN/i-AlyGa1-yN heterojunction is used to effectively restrict holes from entering the absorption region to recombine with electrons, thereby increasing
(Continued)

the carrier lifetime. Furthermore, during device manufacturing the structure is such designed that makes it difficult for photo-generated holes to participate in the photoconductivity so as to realize unipolar conduction of electrons, thereby obtaining a high response speed and high gain current.

20 Claims, 2 Drawing Sheets

(51) Int. Cl.
H01L 31/0224 (2006.01)
H01L 31/0304 (2006.01)
H01L 31/11 (2006.01)

(58) Field of Classification Search
CPC ......... H01L 2924/12031; H01L 29/868; H01L 29/6603; H01L 29/6606; H01L 29/6609; H01L 29/66204; H01L 29/66159; H01L 29/864; H01L 29/66113
USPC .......................................................... 257/94
See application file for complete search history.

(56) References Cited

U.S. PATENT DOCUMENTS

| 2014/0225472 A1* | 8/2014 | Guo ...................... H01L 29/167 310/303 |
| 2014/0367695 A1* | 12/2014 | Barlow ............... H01L 29/2003 257/194 |
| 2016/0172530 A1* | 6/2016 | Tsuji ................... H01L 31/1868 438/94 |

FOREIGN PATENT DOCUMENTS

CN 107863413 A 3/2018
CN 111446332 A 7/2020

OTHER PUBLICATIONS

Written Opinion of the International Search Authority in corresponding International application No. PCT/CN2020/110792.

* cited by examiner

ALGAN UNIPOLAR CARRIER SOLAR-BLIND ULTRAVIOLET DETECTOR AND MANUFACTURING METHOD THEREOF

CROSS-REFERENCE TO RELATED APPLICATIONS

This application is a U.S. continuation of co-pending International Patent Application Number PCT/CN2020/110792, filed on Aug. 24, 2020 with China National Intellectual Property Administration, the disclosure of which is incorporated herein by reference in its entirety.

TECHNICAL FIELD

This disclosure relates to the field of semiconductor technology, and more particularly relates to an AlGaN unipolar carrier solar-blind ultraviolet detector.

BACKGROUND

Solar radiation with a wavelength of 200 nm-280 nm rarely reaches the surface of the earth, so solar-blind ultraviolet detection has very important applications in military and civilian fields. The band gap of AlGaN materials is continuously adjustable from 3.4 eV to 6.2 eV, and the corresponding wavelength ranges from 200 nm to 365 nm. It is one of the major basic materials for solar-blind ultraviolet detectors. Currently, a variety of UV detectors based on AlGaN materials have been studied, and their structure types include photoconductive, Schottky, metal-semiconductor-metal (MSM), p-n junction, and avalanche photodiode (APD). For the time being, various types of AlGaN-based solar-blind ultraviolet detectors are based on the working mode of simultaneous conduction of electrons and holes. In this mode, the probability of electron-hole recombination increases, the recombination rate increases, and the carrier lifetime is shortened. This results in a low detector gain value, a strong composite noise, and a slow response speed, thus making it difficult to meet the high speed and high sensitivity detection requirements.

AlGaN materials have a strong spontaneous polarization effect. According to Gauss's theorem, the change of polarization intensity will give rise to polarization charge at the interface position, and the density and charge type of polarization charge are determined by the magnitude and direction of the polarization intensity change. The abundant heterojunction structures of AlGaN materials create favorable conditions for the regulation and utilization of the polarization electric field. For AlGaN heterojunctions, when the composition of the heterojunction grown along the (0001) orientation becomes larger, positively polarized charges may be formed at the interface. Otherwise when the composition of the heterojunction growing along the (0001) orientation decreases, negatively polarized charges may be formed at the interface. After the double heterojunction AlGaN is formed, due to the effect of the interface charge, the polarization built-in electric field will be generated in the heterojunction AlGaN region. This polarization built-in electric field can play an important role in the separation of photo-generated carriers, and also has a significant role in the design of the detector structure.

SUMMARY

In view of this, there is a need to provide a high-performance AlGaN-based solar-blind ultraviolet detector that can realize unipolar carrier conduction to overcome the defects present in the related art.

To achieve the above object, this disclosure adopts the following technical solutions.

This disclosure provides a method for manufacturing an AlGaN unipolar carrier solar-blind ultraviolet detector, which includes the following operations:

providing a substrate for growing a nitride material;

growing an AlN template on the substrate;

growing n-$Al_xGa_{1-x}N$ on the AlN template, where $x>=0.45$;

growing i-$Al_yGa_{1-y}N$ on the n-$Al_xGa_{1-x}N$, where $y>x$;

growing p-$Al_zGa_{1-z}N$ on the i-$Al_yGa_{1-y}N$, where $0.45<=z<y$;

growing p-GaN on the p-$Al_zGa_{1-z}N$;

etching a photosensitive mesa of the detector on a wafer formed after the above operations are completed;

etching a ring-shaped channel in the photosensitive mesa that reaches the i-$Al_yGa_{1-y}N$ layer;

etching the p-GaN layer surrounded by the ring-shaped channel on the photosensitive mesa with the ring-shaped channel, reaching the p-$Al_zGa_{1-z}N$ layer;

plating an n-electrode around the etched photosensitive mesa and performing rapid thermal annealing; and plating a p-electrode on the p-GaN layer outside the ring-shaped channel of the photosensitive mesa around which the n-electrode is plated, and performing rapid thermal annealing.

In some embodiments, in the operation of providing the substrate for growing the nitride material, the substrate is selected from sapphire or AlN.

In some embodiments, in the operation of growing n-$Al_xGa_{1-x}N$ on the AlN template where $x>=0.45$, the n-$Al_xGa_{1-x}N$ has a thickness of 300 nm, a composition of 0.45, and a doping concentration$>5e18$ $cm^{-3}$.

In some embodiments, in the operation of growing i-$Al_yGa_{1-y}N$ on the n-$Al_xGa_{1-x}N$ where $y>x$, the i-$Al_yGa_{1-y}N$ has a thickness of 200~300 nm and a composition is 0.6, with unintentional doping.

In some embodiments, in the operation of growing p-$Al_zGa_{1-z}N$ on the i-$Al_yGa_{1-y}N$, the p-$Al_zGa_{1-z}N$ has a thickness of 10~50 nm, a composition of 0.45, and a doping concentration$>2e18$ $cm^{-3}$.

In some embodiments, in the operation of growing p-GaN on the p-$Al_zGa_{1-z}N$, the p-GaN has a thickness of 50~150 nm and a doping concentration$>5e18$ $cm^{-3}$.

In some embodiments, in the operation of plating the n-electrode around the etched photosensitive mesa and performing rapid thermal annealing, the n-electrode is selected from Ti/Al/Ni/Au.

In some embodiments, in the operation of plating the p-electrode on the p-GaN layer outside the ring-shaped channel of the photosensitive mesa around which the n-electrode is plated and performing rapid thermal annealing, Ni/Au is selected as the p-electrode.

In addition, this disclosure further provides an AlGaN unipolar carrier solar-blind ultraviolet detector that is manufactured by the above-described method.

This disclosure using the above technical solutions may provide the following advantages.

The AlGaN unipolar carrier solar-blind ultraviolet detector provided by this disclosure is based on the AlGaN polarization effect and uses the double heterojunction of the p-$Al_zGa_{1-z}N$/i-$Al_yGa_{1-y}N$/n-$Al_xGa_{1-x}N$ ($0.45=<x,z<y$) as the main structure of the detector. It makes full use of the polarization built-in electric field pointing from n-type AlGaN to p-type AlGaN to enhance the electric field strength of the i-type absorption region and enhance the efficiency of carrier absorption and separation. At the same time, the valence band step of the p-$Al_zGa_{1-z}N$/i-$Al_yGa_{1-y}N$ heterojunction is used to effectively restrict holes from entering the absorption region to recombine with electrons, thereby increasing the carrier lifetime. Furthermore, during device manufacturing the structure is such designed that makes it difficult for photo-generated holes to participate in the photoconductivity so as to realize unipolar conduction of electrons, thereby obtaining high response speed and high gain current.

The method of manufacturing the AlGaN unipolar carrier solar-blind ultraviolet detector provided by this disclosure has a simple process and is suitable for industrial production.

BRIEF DESCRIPTION OF DRAWINGS

For a clearer understanding of the technical solutions that are used in the embodiments according to the present disclosure or that are used in the related art, hereinafter the drawings that are required for the description of the embodiments disclosed herein or the related art will be briefly introduced. Apparently, the drawings in the following description merely represent some embodiments of the present disclosure, and for those having ordinary skill in the art, other drawings may also be obtained based on these drawings without investing creative efforts.

DETAILED DESCRIPTION

Hereinafter, technical solutions in the embodiments according to the present disclosure will be described in a definite and comprehensive manner in connection with the accompanying drawings in the embodiments according to the present disclosure. Apparently, the embodiments described herein are only a part, rather than all of the embodiments in accordance with the present disclosure. Based on the embodiments of the present disclosure, all other embodiments obtained by those having ordinary skill in the art without investing creative efforts shall all fall in the scope of protection of the present disclosure.

Figure 1:
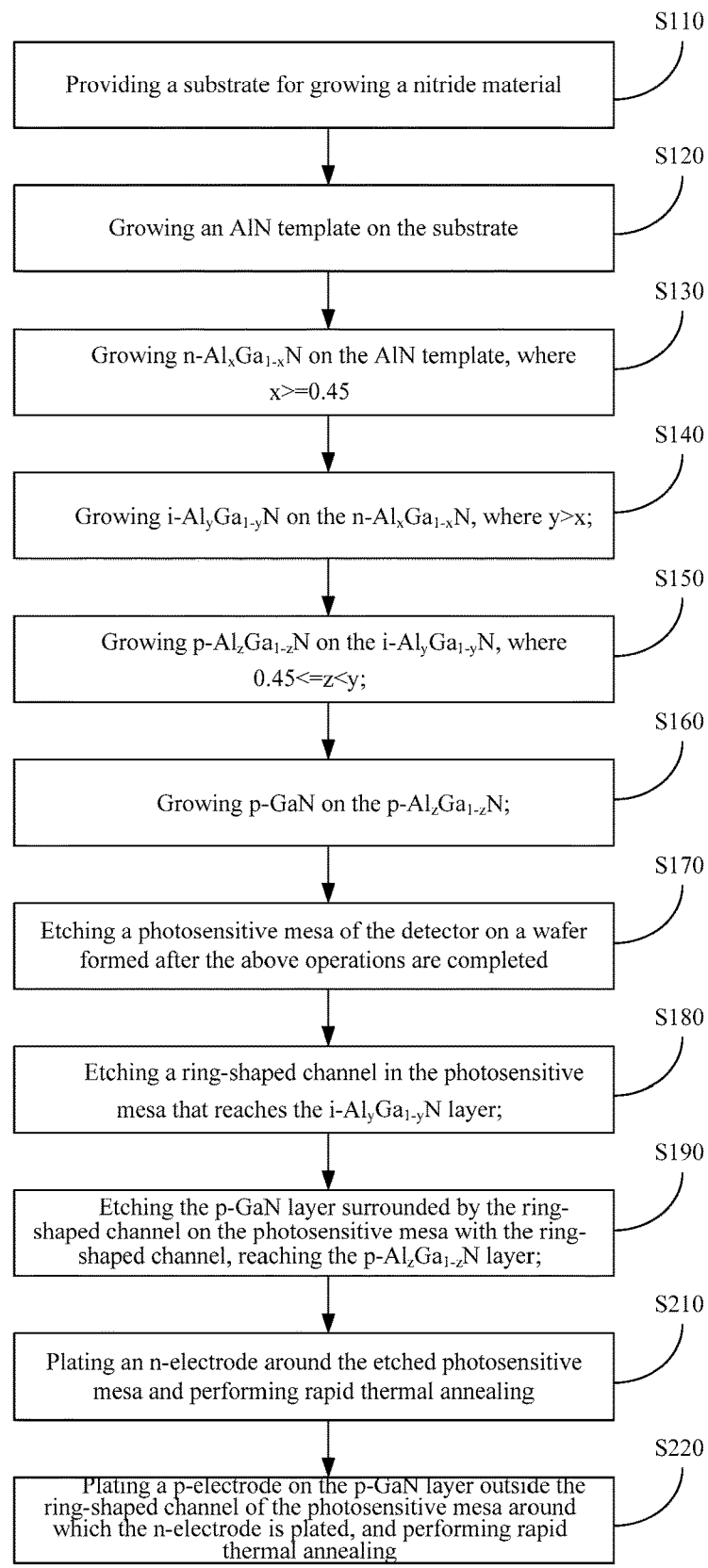
FIG. 1 is a flowchart illustrating the operations of manufacturing an AlGaN unipolar carrier solar-blind ultraviolet detector according to an embodiment of the present disclosure.

FIG. 1 is a flowchart illustrating the operations of a method of manufacturing an AlGaN unipolar carrier solar-blind ultraviolet detector according to an embodiment of the present disclosure. The method may include the following operations.

S110: providing a substrate for growing a nitride material;

In some embodiments, the substrate for growing the nitride material is selected from sapphire or AlN.

S120: growing an AlN template on the substrate;

In particular, the AlN template is grown on the substrate by a growing method such as metal organic chemical vapor deposition (MOCVD), Molecular Beam Epitaxy (MBE), or Hydride Vapor Phase Epitaxy (HVPE), and the typical growth temperature is 1300° C.

S130: growing n-$Al_xGa_{1-x}N$ on the AlN template, where x>=0.45;

In particular, an epitaxial layer of n-$Al_xGa_{1-x}N$ may be grown on the AlN template by an epitaxial method such as MOCVD or MBE.

In some typical embodiments, the n-$Al_xGa_{1-x}N$ may have a thickness of 300 nm, a composition of 0.45, and a doping concentration>5e18 $cm^{-3}$.

S140: growing i-$Al_yGa_{1-y}N$ on the n-$Al_xGa_{1-x}N$, where y>x;

In particular, an epitaxial layer of i-$Al_yGa_{1-y}N$ may be grown on the n-$Al_xGa_{1-x}N$ epitaxial layer by a growing method such as MOCVD or MBE.

In some typical embodiments, the i-$Al_yGa_{1-y}N$ may have a thickness of 200~300 nm, a composition of 0.6, with unintentional doping.

S150: growing p-$Al_zGa_{1-z}N$ on the i-$Al_yGa_{1-y}N$, where 0.45<=z<y;

In particular, an epitaxial layer of p-$Al_zGa_{1-z}N$ may be grown on the i-$Al_yGa_{1-y}N$ epitaxial layer by a growing method such as MOCVD or MBE.

In some typical embodiments, the p-$Al_zGa_{1-z}N$ may have a thickness of 10~50 nm, a composition of 0.45, and a doping concentration>2e18 $cm^{-3}$.

S160: growing p-GaN on the p-$Al_zGa_{1-z}N$;

In particular, an epitaxial layer of p-GaN may be grown on the p-$Al_zGa_{1-z}N$ epitaxial layer by a growing method such as MOCVD or MBE.

In some typical embodiments, the p-GaN may have a thickness of 50~150 nm and a doping concentration>5e18 $cm^{-3}$.

S170: etching a photosensitive mesa of the detector on a wafer formed after the above operations are completed;

In particular, the photosensitive mesa of the detector may be etched on a wafer formed after the above operations are completed using inductively coupled plasma (ICP) etching technique, where the mesa etching gas may be $Cl_2$ and $BCl_3$, and the etched depth may reach n-$Al_xGa_{1-x}N$ layer, where the etched depth is determined by the etching duration.

S180: etching a ring-shaped channel in the photosensitive mesa that reaches the i-$Al_yGa_{1-y}N$ layer;

In particular, the inductively coupled plasma (ICP) etching technique may be used to etch the ring-shaped channel in the photosensitive mesa. The etching gas for the ring-shaped isolation channel may be $Cl_2$ and $BCl_3$, and the etched depth may reach the i-$Al_yGa_{1-y}N$.

S190: etching the p-GaN layer surrounded by the ring-shaped channel on the photosensitive mesa with the ring-shaped channel, reaching the p-$Al_zGa_{1-z}N$ layer.

In particular, the inductively coupled plasma (ICP) etching technique may be used to etch the p-GaN layer surrounded by the ring-shaped channel in the photosensitive mesa with the ring-shaped channel, where the etching gas may be $Cl_2$ and $BCl_3$, and the etched depth may reach the p-$Al_zGa_{1-z}N$.

S210: plating an n-electrode around the etched photosensitive mesa and performing rapid thermal annealing; and In particular, the electrode forming area may be created on the n-$Al_xGa_{1-x}N$ layer by photolithography, and the n-$Al_xGa_{1-x}N$ ohmic contact electrode metal may be deposited by means such as vacuum evaporation or magnetron sputtering.

In some typical embodiments, the n-electrode is selected from Ti/Al/Ni/Au.

S220: plating a p-electrode on the p-GaN layer outside the ring-shaped channel of the photosensitive mesa around which the n-electrode is plated, and performing rapid thermal annealing.

In particular, the electrode forming area may be created on the p-GaN epitaxial layer outside the ring-shaped isolation channel by photolithography, and the p-GaN ohmic contact electrode metal may be deposited by means such as vacuum evaporation or magnetron sputtering.

In some typical embodiments, the p-electrode is selected from Ni/Au.

Figure 2:
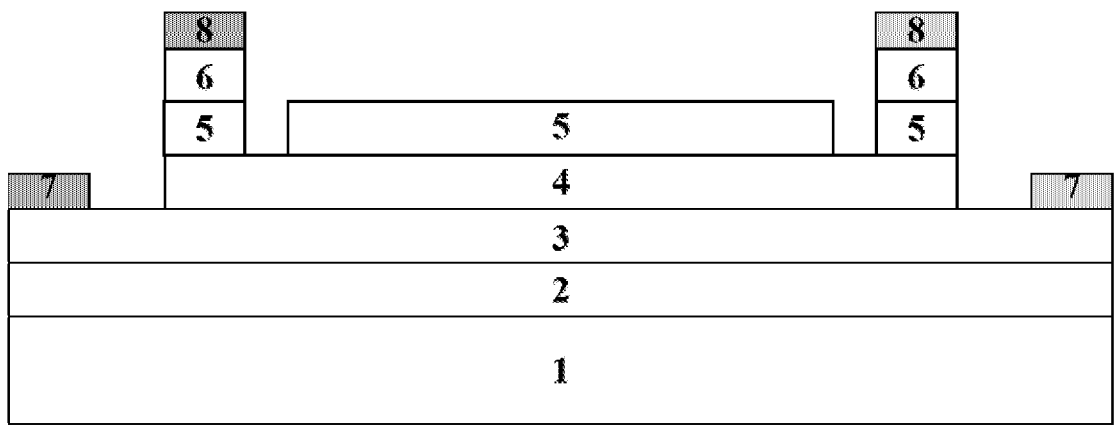
FIG. 2 is a schematic diagram of an AlGaN unipolar carrier solar-blind ultraviolet detector according to an embodiment of the present disclosure.

Referring now to FIG. 2, which is a schematic diagram illustrating the structure of an AlGaN unipolar carrier solar-blind ultraviolet detector manufactured by the above-described method according to the present disclosure, the detector including a sapphire substrate 1, an AlN epitaxial layer 2, an n-$Al_xGa_{1-x}N$ 3, an i-$Al_yGa_{1-y}N$ 4, a p-$Al_zGa_{1-z}N$ 5, a p-GaN 6, an n-type ohmic electrode 7, and a p-type ohmic electrode 8.

The method of manufacturing the AlGaN unipolar carrier solar-blind ultraviolet detector provided by the foregoing embodiment of the present disclosure has a simple process and is suitable for industrial production. The AlGaN unipolar carrier solar-blind ultraviolet detector such produced is based on the AlGaN polarization effect and uses the double heterojunction of the p-$Al_zGa_{1-z}N$/i-$Al_yGa_{1-y}N$/n-$Al_xGa_{1-x}N$ ($0.45=<x,z<y$) as the main structure of the detector. It makes full use of the polarization built-in electric field pointing from n-type AlGaN to p-type AlGaN to enhance the electric field strength of the i-type absorption region and enhance the efficiency of carrier absorption and separation. At the same time, the valence band step of the p-$Al_zGa_{1-z}N$/i-$Al_yGa_{1-y}N$ heterojunction is used to effectively restrict holes from entering the absorption region to recombine with electrons, thereby increasing the carrier lifetime. Furthermore, during device manufacturing the structure is such designed that makes it difficult for photo-generated holes to participate in the photoconductivity so as to realize unipolar conduction of electrons, thereby obtaining high response speed and high gain current.

Of course, the AlGaN unipolar carrier solar-blind ultraviolet detector according to this disclosure may also have a variety of transformations and modifications, and will not be limited to the specific structures that are illustrated in the foregoing embodiments. In short, the scope of protection of the present disclosure should include those alterations, transformations and modifications that are obvious to those having ordinary skill in the art.

What is claimed is:
1. A method for manufacturing an AlGaN unipolar carrier solar-blind ultraviolet detector, comprising:
    providing a substrate for growing a nitride material;
    growing an AlN template on the substrate;
    growing n-$Al_xGa_{1-x}N$ on the AlN template, where $x>=0.45$;
    growing i-$Al_yGa_{1-y}N$ on the n-$Al_xGa_{1-x}N$, where $y>x$;
    growing p-$Al_zGa_{1-z}$ on the i-$Al_yGa_{1-y}N$, where $0.45<=z<y$;
    growing p-GaN on the p-$Al_zGa_{1-z}N$;
    etching a photosensitive mesa of the AlGaN unipolar carrier solar-blind ultraviolet detector on a wafer formed after the above operations are completed;
    etching a ring-shaped channel in the photosensitive mesa that reaches the i-$Al_yGa_{1-y}N$ layer;
    etching the p-GaN layer surrounded by the ring-shaped channel on the photosensitive mesa with the ring-shaped channel, reaching the p-$Al_zGa_{1-z}N$ layer;
    plating an n-electrode around the etched photosensitive mesa and performing rapid thermal annealing; and
    plating a p-electrode on the p-GaN layer outside the ring-shaped channel of the photosensitive mesa around which the n-electrode is plated, and performing rapid thermal annealing.

2. The method of claim 1, wherein in the operation of providing the substrate for growing the nitride material, the substrate is selected from sapphire or AlN.

3. The method of claim 1, wherein in the operation of growing n-$Al_xGa_{1-x}N$ on the AlN template where $x>=0.45$, the n-$Al_xGa_{1-x}N$ has a thickness of 300 nm, an Al mole-composition of 0.45, and a doping concentration greater than $5e18$ cm$^{-3}$.

4. The method of claim 1, wherein in the operation of growing i-$Al_yGa_{1-y}N$ on the $Al_xGa_{1-x}N$ where $y>x$, the i-$Al_yGa_{1-y}N$ has a thickness of 200 to 300 nm and an Al mole-composition is 0.6, with unintentional doping.

5. The method of claim 1, wherein in the operation of growing p-$Al_zGa_{1-z}N$ on the i-$Al_yGa_{1-y}N$, the p-$Al_zGa_{1-z}N$ has a thickness of 10 to 50 nm, an Al mole-composition of 0.45, and a doping concentration greater than $2e18$ cm$^{-3}$.

6. The method of claim 1, wherein in the operation of growing p-GaN on the p-$Al_zGa_{1-z}N$, the p-GaN has a thickness of 50 to 150 nm and a doping concentration greater than $5e18$ cm$^{-3}$.

7. The method of claim 1, wherein in the operation of plating the n-electrode around the etched photosensitive mesa and performing rapid thermal annealing, the n-electrode is selected from Ti, Al, Ni, or Au.

8. The method of claim 1, wherein in the operation of plating the p-electrode on the p-GaN layer outside the ring-shaped channel of the photosensitive mesa around which the n-electrode is plated and performing rapid thermal annealing, the p-electrode is selected from Ni or Au.

9. The method of claim 1, wherein the AlN template is grown on the substrate by a growing method comprising metal organic chemical vapor deposition (MOCVD), molecular beam epitaxy (MBE), or hydride bapor phase epitaxy (HYPE).

10. The method of claim 1, wherein the AlN template is grown on the substrate at a growth temperature of 1300° C.

11. The method of claim 1, wherein the operation of growing n-$Al_xGa_{1-x}N$ on the AlN template comprises growing an epitaxial layer of n-$Al_xGa_{1-x}N$ on the AlN template by an epitaxial method MOCVD or MBE.

12. The method of claim 1, wherein the operation of growing i-$Al_yGa_{1-y}N$ on the n-$Al_xGa_{1-x}N$ comprises growing an epitaxial layer of i-$Al_yGa_{1-y}N$ on the n-$Al_xGa_{1-x}N$ epitaxial layer by a growing method MOCVD or MBE.

13. The method of claim 1, wherein the operation of growing p-$Al_zGa_{1-z}N$ on the i-$Al_yGa_{1-y}N$ comprises growing an epitaxial layer of p-$Al_zGa_{1-z}N$ on the i-$Al_yGa_{1-y}N$ epitaxial layer by a growing method MOCVD or MBE.

14. The method of claim 1, wherein the operation of growing p-GaN on the p-$Al_zGa_{1-z}N$ comprises growing an epitaxial layer of p-GaN on the p-$Al_zGa_{1-z}N$ epitaxial layer by a growing method MOCVD or MBE.

15. The method of claim 1, wherein the operation of etching the photosensitive mesa of the detector on the wafer comprises etching the photosensitive mesa of the detector on the wafer using inductively coupled plasma (ICP) etching technology, with a mesa etching gas of $Cl_2$ and $BCl_3$, and an etched depth that reaches n-$Al_xGa_{1-x}N$ layer, wherein the etched depth is determined by an etching duration.

16. The method of claim 1, wherein the operation of etching the ring-shaped channel in the photosensitive mesa that reaches the i-$Al_yGa_{1-y}N$ layer comprises etching the ring-shaped channel in the photosensitive mesa using inductively coupled plasma (ICP) etching technique, with an etching gas of $Cl_2$ and $BCl_3$, and an etched depth reaches the i-$Al_yGa_{1-y}N$.

17. The method of claim 1, wherein the operation of etching the p-GaN layer surrounded by the ring-shaped channel on the photosensitive mesa with the ring-shaped channel comprises etching the p-GaN layer surrounded by the ring-shaped channel in the photosensitive mesa with the ring-shaped channel using inductively coupled plasma (ICP) etching technique, with an etching gas of $Cl_2$ and $BCl_3$, and an etched depth that reaches the $p\text{-}Al_zGa_{1-z}N$.

18. The method of claim 1, wherein the operation of plating the n-electrode around the etched photosensitive mesa and performing rapid thermal annealing comprises creating an electrode forming area on the $n\text{-}Al_xGa_{1-x}N$ layer by photolithography, and depositing an $n\text{-}Al_xGa_{1-x}N$ ohmic contact electrode metal by means of vacuum evaporation or magnetron sputtering.

19. The method of claim 1, wherein the operation of plating the p-electrode on the p-GaN layer outside the ring-shaped channel of the photosensitive mesa around which the n-electrode is plated and performing rapid thermal annealing comprises creating an electrode forming area on the p-GaN epitaxial layer outside the ring-shaped isolation channel by photolithography, and depositing a p-GaN ohmic contact electrode metal by means of vacuum evaporation or magnetron sputtering.

20. An AlGaN unipolar carrier solar-blind ultraviolet detector that is manufactured using the method of claim 1.

* * * * *